(12) United States Patent
Tung et al.

(10) Patent No.: US 6,543,676 B2
(45) Date of Patent: Apr. 8, 2003

(54) PIN ATTACHMENT BY A SURFACE MOUNTING METHOD FOR FABRICATING ORGANIC PIN GRID ARRAY PACKAGES

(75) Inventors: I-Chung Tung, Hsinchu (TW); Shih-Ping Hsu, Tao Yuan (TW)

(73) Assignee: Phoenix Precision Technology Corporation (TW)

( * ) Notice: Subject to any disclaimer, the term of this patent is extended or adjusted under 35 U.S.C. 154(b) by 0 days.

(21) Appl. No.: 09/873,616

(22) Filed: Jun. 4, 2001

(65) Prior Publication Data

US 2002/0179692 A1 Dec. 5, 2002

(51) Int. Cl.$^7$ .......................... B23K 31/02; B23K 31/00
(52) U.S. Cl. .............. 228/215; 228/180.21; 228/180.22
(58) Field of Search .......................... 228/215, 180.1, 228/180.21, 180.22, 165, 248.1, 254; 174/250, 251, 258–261, 263, 266; 361/400, 401, 403, 404, 409, 751, 767

(56) References Cited

U.S. PATENT DOCUMENTS

| | | | | |
|---|---|---|---|---|
| 5,313,021 A | * | 5/1994 | Sajja et al. | 174/258 |
| 5,400,948 A | * | 3/1995 | Sajja et al. | 228/180.1 |
| 5,982,635 A | * | 11/1999 | Menzies et al. | 257/692 |
| 6,194,667 B1 | * | 2/2001 | Jimarez et al. | 174/261 |
| 6,229,207 B1 | * | 5/2001 | Master | 257/690 |
| 6,350,136 B1 | * | 2/2002 | Eckblad et al. | 439/259 |

* cited by examiner

Primary Examiner—Tom Dunn
Assistant Examiner—Zidia Pittman

(57) ABSTRACT

A pin attachment method for mounting the pins on a wiring substrate for fabricating a pin grid array package is disclosed. There is provided an organic wiring board including a surface bearing electrical circuitry which includes at least one contact pad for receiving a pin. A solder mask layer which is placed on the board surface and patterned to expose the pad. The solder mask layer which does not cover any portion of the pad and forms a well by the perimeter of the solder mask layer around the pad. Subsequently, a pin and a solder material which are placed over said pad in the well. The pin which is soldered to the pad by a temperature sufficient to melt the solder material.

10 Claims, 7 Drawing Sheets

US 6,543,676 B2

PIN ATTACHMENT BY A SURFACE MOUNTING METHOD FOR FABRICATING ORGANIC PIN GRID ARRAY PACKAGES

BACKGROUND OF THE INVENTION

1. Field of Invention

This invention relates generally to organic pin grid array packages. More particularly, the present invention relates to a method of surface mounting the pins for fabricating an organic pin grid array package.

2. Background of the Invention

There are many instances, in which under functional or economic considerations it is desirable to be able to alter the set of electrical components on a circuit board but simultaneously be able to avoid the expense of a board redesign or replacement of an otherwise good circuit board. For example, a computer user may hope to upgrade a computer to include a more powerful and lower voltage-supply microprocessor to replace the old one. However, such changes are often difficult to achieve, because currently a variety of the packaged electrical components are generally soldered to a printed circuit board by means of either the surface mounting technique or through-hole mounting technique.

It has been common to mount a socket or an adaptor on a circuit board, in which the socket or adaptor provides interconnect routing of electrical signals between the electrical components and circuit board. The electrical components prevailingly tend to use pin grid array (PGA) packages and can be plugged into the socket or the adaptor. Consequently, the set of electrical components can be replaced by merely unplugging the old one out of the socket or the adaptor and then plugging a new one into the socket or the adaptor but without the need to further replace the circuit board.

The PGA packages have been used extensively to house integrated circuits, because the array of pins which extend orthogonal from the bottom of the package permits a large number of pins, which is essential for complex circuits with high input-output requirements. The typical prior art PGA-packaged integrated circuit chips are illustrated in FIGS. 1 and 2. Referring to FIG. 1, a typical cavity down PGA assembly 100 includes a plastic wiring substrate (or say PGA substrate) 101 with a recess cavity 102 and a heat slug or heat spreader 103 bonded to said substrate 101. A chip 104 is mounted on the heat spreader 103 inside the recess cavity 102. The conductive wires 105 are used to electrically interconnect the chip 104 with the substrate 101. After the wire bonding process, the cavity 102 is filled up with an encapsulant 106 to cover and protect the bonding wires 105 and chip 106 against environmental degradation. The external connection pins 107, by which the substrate 101 will be electrically connected to a socket or an adaptor, are attached to appropriate areas on the top surface 108 of the substrate 101. As an alternative structure, an additional heat sink may be attached to the backside 109 of the heat spreader 103 if necessary for further enhancing heat dissipation.

Another example of the prior art PGA-packaged integrated circuit chips is shown in FIG. 2, in which the packaging assembly 200 includes a chip 201 being mounted on a wiring substrate (or say PGA substrate) 202 by means of the solder balls 203. The area beneath the chip 201 is covered for protection by an underfill resin 204 which serves as an encapsulant for the sensitive electrical connections (i.e. the solder balls 203). The external connection pins 205, by which the chip 201 is electrically connected to a socket or an adaptor, are attached to appropriate areas on the top surface 206 of the chip 201. In order to further enhance thermal dissipating performance, an additional heat sink may be attached directly to the backside of the substrate 202. This type of the package is so-called flip chip-pin grid array (FC-PGA) package and has been early proposed by the IBM Corp. in the U.S. Pat. Nos. 3,921,285 (B. Krall) and 4,092,697 (R. N. Spaight).

There are two common existing methods, i.e. through-hole mounting and surface mounting, to attach the pins, such as pins 107 or 205, onto an organic PGA substrate, as shown in FIG. 3. FIG. 3A shows the so-called pass through-hole mounting method which involves the use of a PGA substrate 301 containing a conductive through hole 302 with plated metal 303 to receive a pin 304, in which a solder material 305 is used to form the solder joint.

FIG. 3B illustrates a non-pass through-hole mounting method (i.e. the hole doesn't pass through the substrate 401), in which a PGA substrate 401 (including conductive layer 401a and organic dielectric layer 401b) has a conductive via 402 containing a plated metal 403 to receive a pin 404 and a solder material 405 is used to form a solder joint.

FIG. 3C illustrates a surface mounting method, in which a pad 501 and a layer of solder mask material 502 are made on the surface of an organic substrate 503. The solder mask layer 502 only partially covers a portion of the pad 501 and leaves an opening 504 to receive a pin 505. A solder material 506 is used to form a solder joint between the pad 501 and pin 505.

The major disadvantage with the through-hole technique is that the through hole should be large (e.g. at least larger than 15 mil in diameter) for through-soldering being feasible, which however adversely impacts miniaturization of electronic products. In contrast, for the surface mounting method, the strength of the solder joint is proportional to the height h of the solder joint and the size of the opening 504, as illustrated in FIG. 3C, which is normally much weaker than that of solder joint made by the through-hole technique. However, the surface mounting method is undoubtedly doubt a lower cost manufacturing method compared to the through-hole technique, since the processing step to form the holes for receiving the pins in the wiring substrate could be skipped.

It is therefore desirable to provide a surface mounting method to surface mount the pins onto the PGA substrate, which exhibits the benefits of higher strength of the solder joint, higher reliability, and low manufacturing cost.

SUMMARY OF INVENTION

It is therefore an objective of the present invention to provide a surface mounting method for attaching the pins onto an organic PGA substrate, which is able to result in improved strength and reliability of the solder joint in a PGA package used to electrically interconnect with a socket or an adaptor.

Another objective of this invention is to adopt a method, in which the solder mask layer does not cover any portion of the pad and is configured to allow a solder material to fully fill a well enclosed by the perimeter of the solder mask layer. After pin attachment, the solder material covers and holds firmly the pad.

In summary, a pin attachment method for mounting the pins on a wiring substrate for fabricating a pin grid array package is disclosed. According to the present invention, there is provided an organic wiring board including a surface bearing electrical circuitry which includes at least one contact pad for receiving a pin. A solder mask layer which is placed on the board surface and patterned to expose the pad, and the solder mask layer which does not cover any portion of the pad and forms a well by the perimeter of the solder mask layer around the pad. Subsequently, a pin and a solder material which are placed over the pad in the well. The pin which is then soldered to said pad by a temperature sufficient to melt the solder material.

DETAILED DESCRIPTION OF A PREFERRED EMBODIMENT

For a better understanding on the advantages and capabilities of the present invention, reference is made to the following disclosure, appended claims in connection with the accompanying drawings.

The invention provides a surface mounting method for attaching the pins onto an organic PGA substrate, which is able to result in improved strength and reliability of the solder joint in a PGA package used to electrically interconnect with a socket or an adaptor. The method is detailed as follows. Like numbers refer to like elements throughout. However, the figures are simply illustrative of the process, and are not drawn to scale, i.e. they do not reflect the actual dimensions or features of the various layers in the chip package structure.

Figure 1:
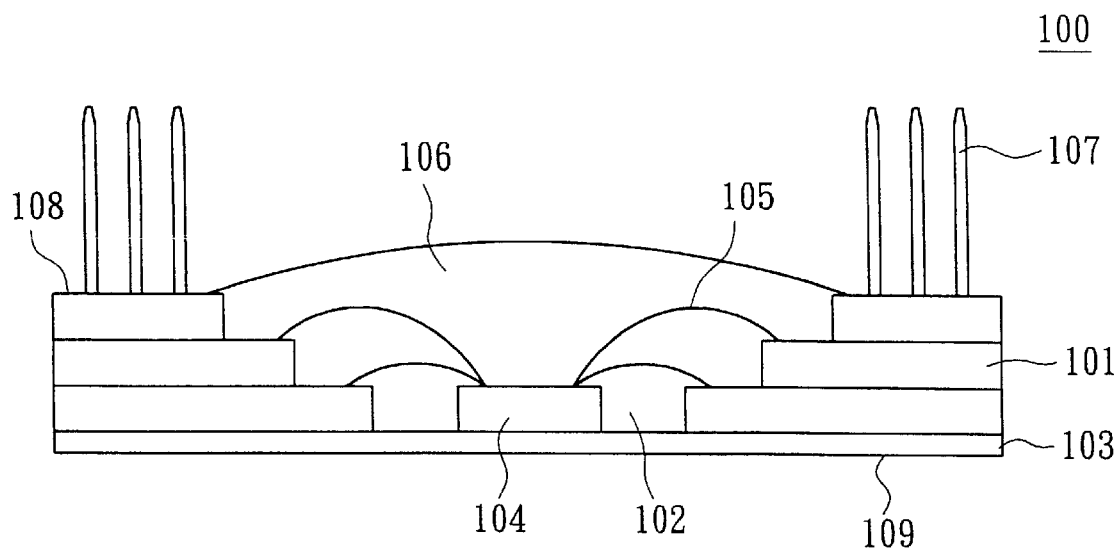
FIG. 1 is a cross-sectional view of a prior art cavity down chip carrier based on wiring bond technique.
Figure 2:
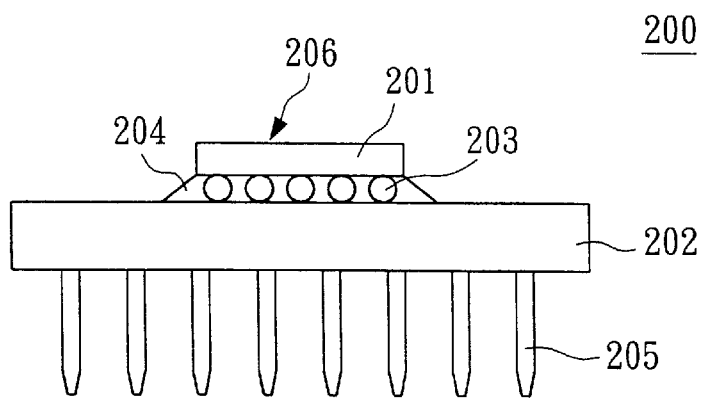
FIG. 2 is a cross-sectional view of a prior art flip chip pin grid array package.
Figure 3A:
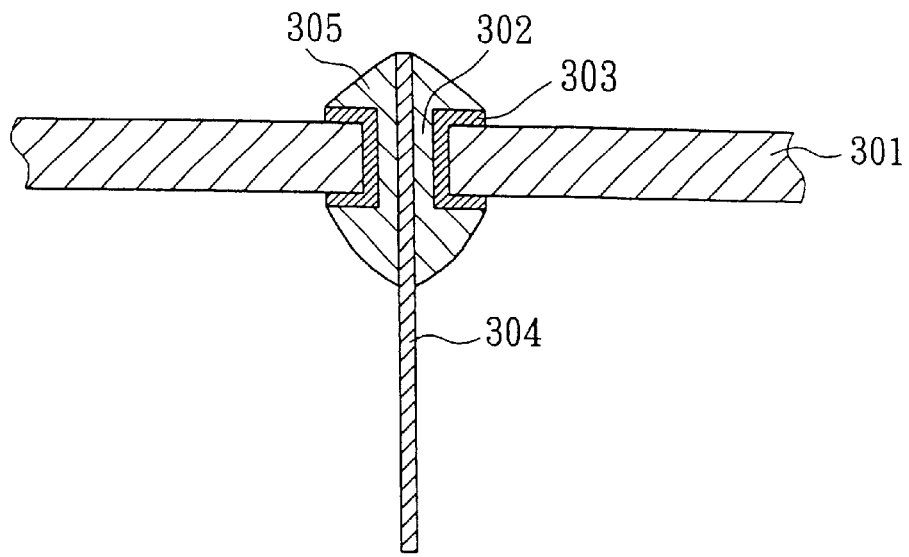
FIG. 3A illustrates, in a cross-sectional view, a prior art pass through-hole mounted pin.
Figure 3B:
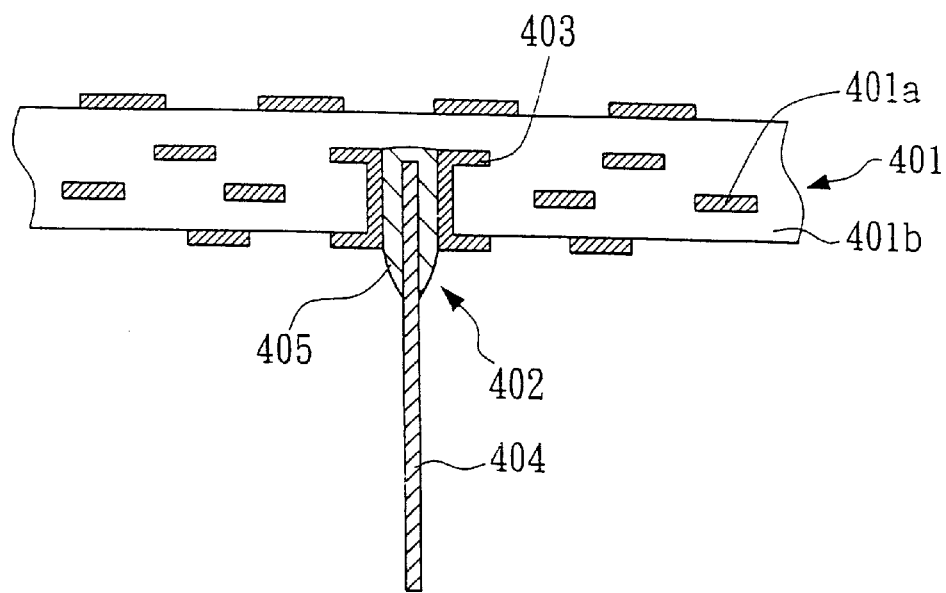
FIG. 3B illustrates, in a cross-sectional view, a prior art non-pass through-hole mounted pin.
Figure 3C:
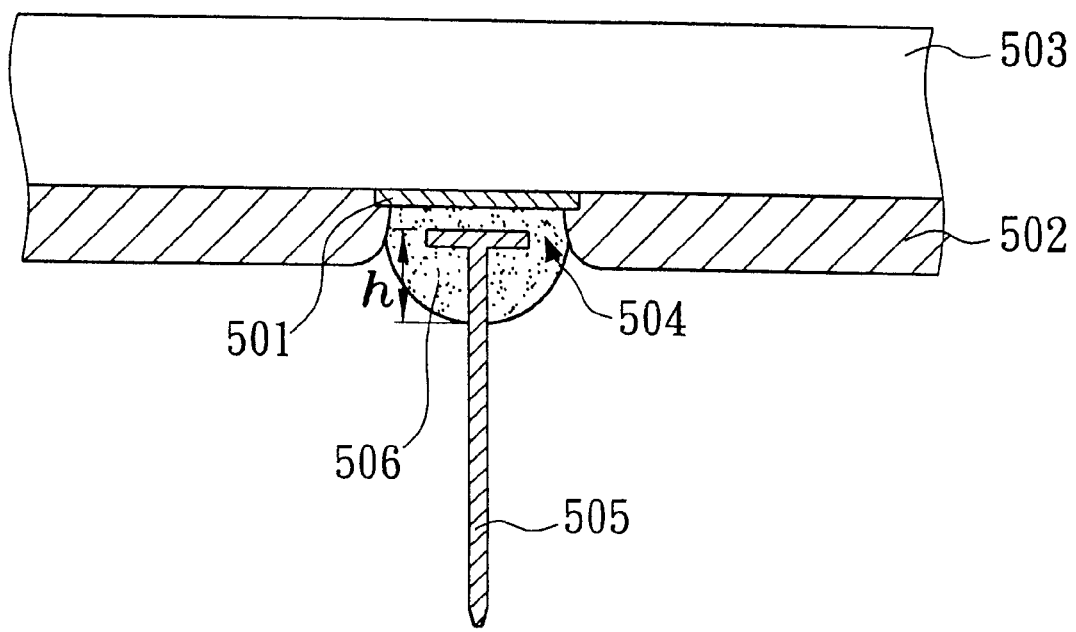
FIG. 3C illustrates, in a cross-sectional view, a prior art surface mounted pin.
Figure 4A:
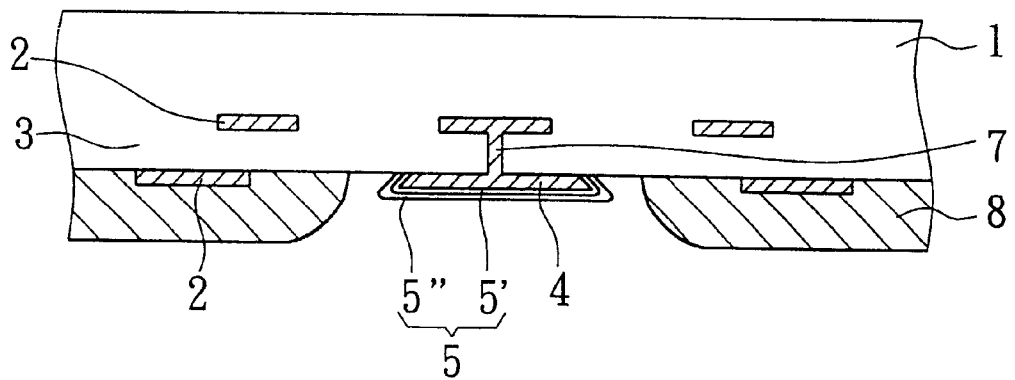
FIGS. 4A and 4B illustrate, in cross-sectional and plan views respectively, a configuration of a via-in-pad in accordance with one embodiment of the present invention.
Figure 4B:
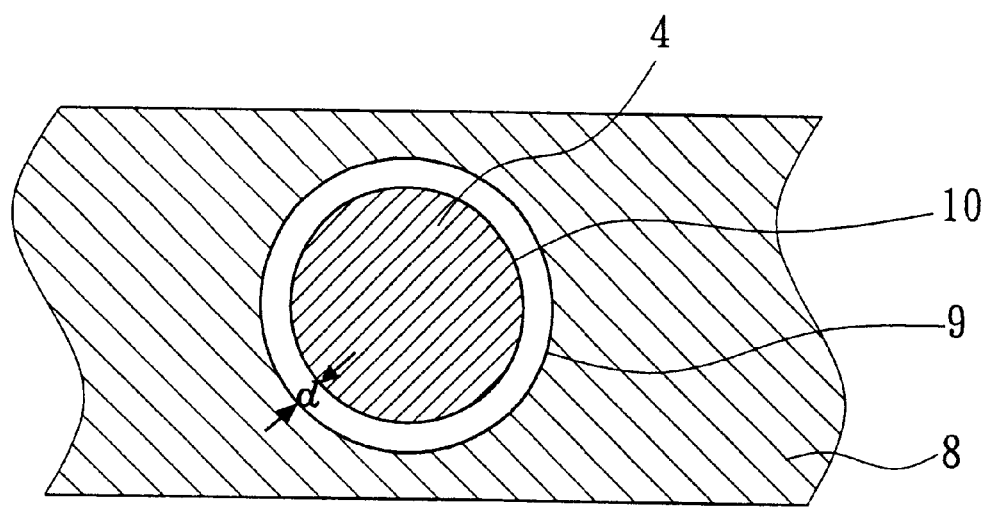

Now referring to FIG. 4A, in accordance with a preferred embodiment of the present invention, there is initially provided an organic wiring substrate 1, which has the wiring circuit layers 2 separated by the organic insulating layers 3 and at least a pad 4 is formed on the surface thereof. Said circuit layers 2 may be made of a conductive material, such as metal, conductive polymers, metal powders embedded in a resin or carbon powders embedded in a resin, etc. It is preferred to use metal, such as copper, silver, or aluminum, to form said circuit layers 2. Said insulative layers 3 may be made of an organic material or a fiber-reinforced organic material or a particle-reinforced organic material, etc., for example, epoxy resin, polyimide, bismeleimide triazine, cyanate ester, polybenzocyclobutene, or glass fiber composite thereof, etc. Said pad 4 is formed typically from a material such as copper, and may generally have a thickness of about 1 mil and a diameter in the range of 10 mil to 30 mil. A popular barrier layer 5 includes an adhesive layer 5' of nickel and a protective layer 5" of gold is then formed to cover said pad 4. However, said barrier layer 5 may also be made of nickel, palladium, silver, tin, nickel/palladium, chromium/titanium, palladium/gold, or nickel/palladium/gold, etc., which can be formed by electoplating, electroless plating, or physical vapor deposition, etc. A conductive via 7 beneath said pad 4 is made to route the electrical signals between said pad 4 and conductive traces 2. In such a case, said pad 4 is just so-called via-in-pad. A solder mask layer 8 is deposited on the surface of said wiring substrate 1 to protect the circuitry and provide insulation. It should be noted that said solder mask layer 8 does not cover any portion of said pad 4, whereas in the previous case shown in FIG. 3C said solder mask layer 502 does cover a portion of said pad 501 surface. Therefore, as illustrated on FIG. 4B, the perimeter 9 of said solder mask layer 8 ends on the surface of said organic insulative layer 3 but not on said pad 4, with a distance d between the perimeter 9 of said solder mask layer 8 and the outer perimeter 10 of said pad 4. The perimeter 9 of said solder mask layer 8 normally forms a well and defines an area for the subsequent pin surface mounting.

Figure 4C:
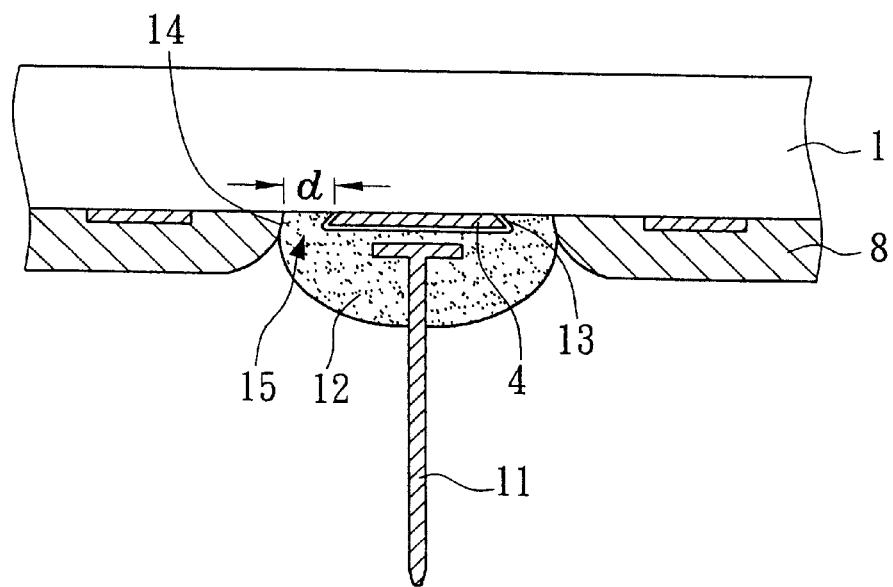
FIG. 4C illustrates, in a cross-sectional view, a surface mounted pin in accordance with one embodiment of the present invention.

Thereafter, a pin 11 is soldered to said pad 4, as illustrated in FIG. 4C. Said pin 11 is generally a metal lead, preferably made of copper, on the surface of which a popular barrier layer including an adhesive layer of nickel and a protective layer of gold may be made. Said barrier layer may also be made of nickel, palladium, silver, tin, nickel/palladium, chromium/titanium, palladium/gold, or nickel/palladium/gold, etc., which can be formed by electoplating, electroless plating, or physical vapor deposition, etc. The solder joint between said pin 11 and pad 4 can be formed in several ways. For instance, the solder material 12 and/or a flux may first be deposited on said pad 4, using a method such as screen printing method, etc. Subsequently, at a reflow temperature, said pin 11 whose end is coated with a flux is placed on said pad 4, so that upon cooling said solder joint is accomplished. Another example is that said solder material 12 and/or a flux may be deposited on one end of said pin 11 first. Next, at a reflow temperature, said pin 11 containing said solder material 12 is placed on said pad 4 which may be coated with a flux, so that upon cooling said solder joint is accomplished. Further another example may be that said solder material 12 and/or a flux can be deposited on both said pad 4 and one end of said pin 11. Then, said pin 11 and pad 4 are soldered at a reflow temperature. However, in all above examples, once the portion of said gold layer contacts said solder material 12, that portion of gold would be dissolved into said solder material 12. Also, said solder material 12 is an alloy made by the mixture of the elements selected from the group consisting of lead, tin, silver, copper, bismuth, antimony, zinc, nickel, aluminum, magnesium, indium, tellurium, and gallium, etc. After the soldering process, a cleaning process, e.g. ultrasonic cleaning, may be conducted to remove the flux residues. It is to be noted here that, according to the practical operation, the adhesion strength of said pad 4 on the surface of said wiring substrate 1 is commonly higher than that of the solder joint between said pin 11 and wiring substrate 1, which is essential for improving the solder joint of said pin 11 on said pad 4 with said solder material 12 holding firmly said pad 4 according the present invention.

According to the present invention, the side wall 13 of said pad 4 may slant a little toward the center of said pad 4, as illustrated in FIG. 4C, which could be carefully made by the conventional photoresist-etching method. In such a case, the break strength of said solder joint between said pin 11 and pad 4 can be further increased, since said inclined side wall 13 would increase the contact area between said solder material 12 and said pin 11 and thus a higher adhesion strength, and also said solder material 12 beneath said inclined side wall 13 could be more or less buckled up when said solder material 12 is subjected to a upward force (i.e. a normal force to the surface of said pad 4).

Importantly, said solder mask layer 8 should be processed to possess the inclined side wall 14, which allow said solder material 12 to easily fill the recess 15. Also, said distance d should be properly controlled, since too small said distanced may cause said recess 15 difficult to be fully filled by said solder material 12 and too large said distance d may cause said solder material 12 flow laterally and decrease the contact area between said solder material 13 and pin 11.

Figure 4D:
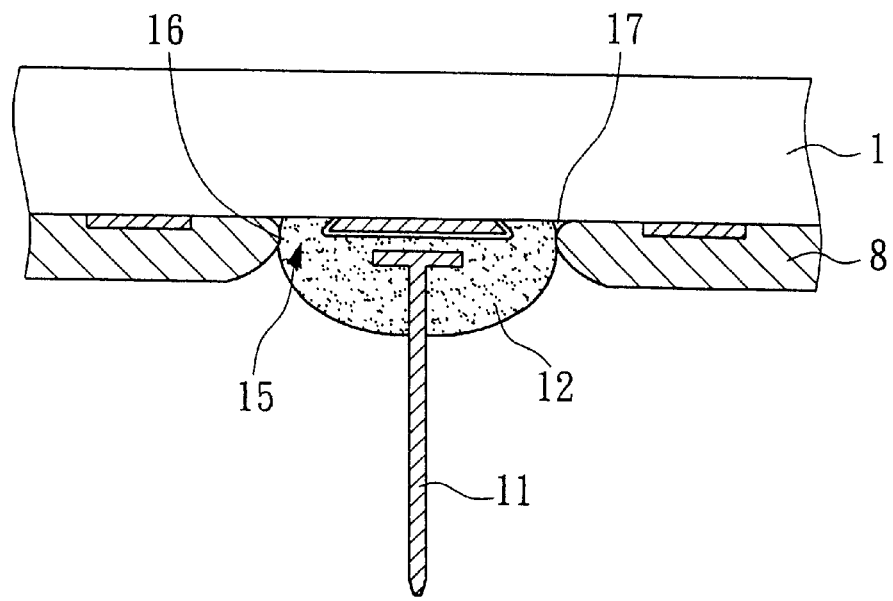
FIG. 4D illustrates, in a cross-sectional view, a surface mounted pin with the formation of voids.

For instance, as shown in FIG. 4D, if the solder mask layer 8 has the convex side wall 16, said solder material 12 is harder to fill the recess 15 and thus easier to form the void 17, which would significantly deteriorate the reliability of the solder joint. In general, the shape of said side wall 14 or 16 can be tailored by adjusting the UV exposure time and developing time, which will be easily recognized by those skilled in the art.

Figure 5:
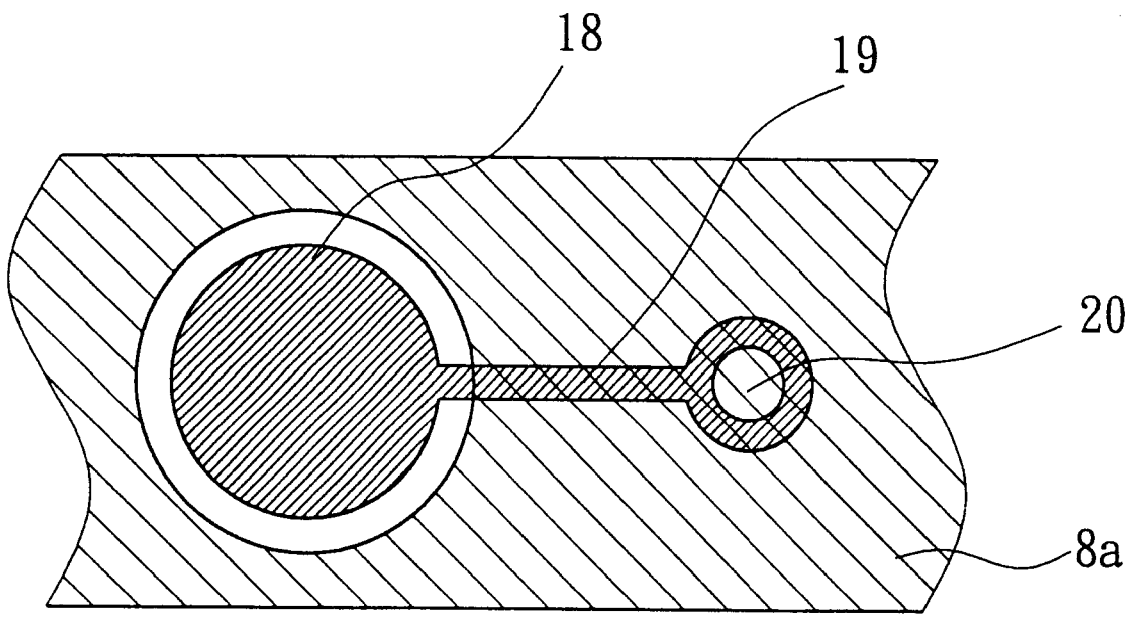
FIG. 5 illustrates, in a plan view, a pad electrically connected with a via covered with a solder mask layer in accordance with one embodiment of the present invention.

In accordance with a preferred embodiment of the present invention, the application of the surface mounting method of the present invention is not limited to said via-in-pads but can be used for any kind of pads. For example, referring next to FIG. 5, for another pad 18 with a conductive trace 19 connected to a via 20, a solder mask layer 8 is deposited and does not cover any portion of said pad 18 but covers a portion of said conductive trace 19. As detailed previously, a pin can also be attached onto said pad 18 by using to the surface mounting method of the present invention.

Figure 6:
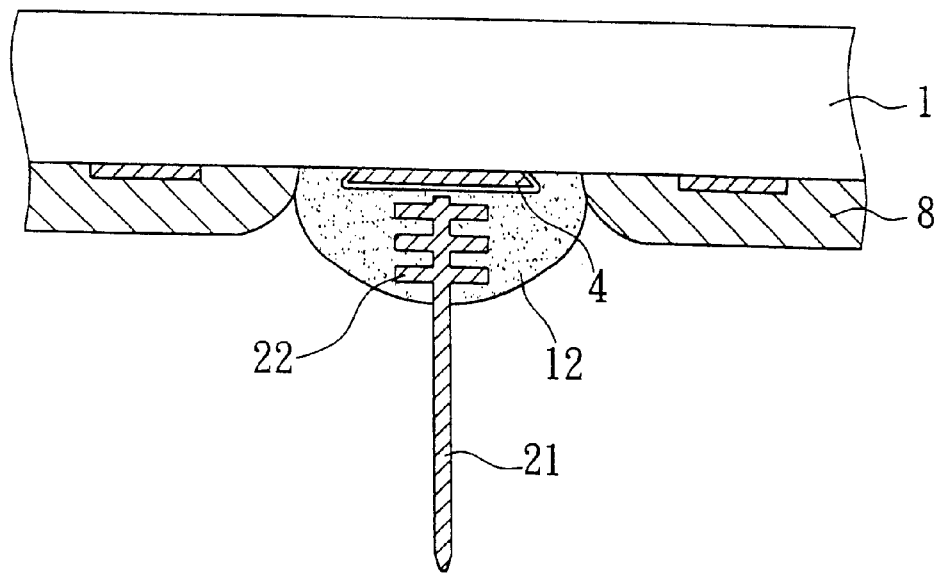
FIG. 6 illustrates, in a cross-sectional view, a surface mounted pin with a dendrite configuration at one end in accordance with one embodiment of the present invention.

In accordance with a preferred embodiment of the present invention, said pin 11 is not limited to any shape or configuration. For instance, as. shown in FIG. 6, a pin 21 with the dendrites 22 at one end thereof can increase the contact area between said solder material 12 and pin 21 to offer a higher adhesion strength.

Figure 7:
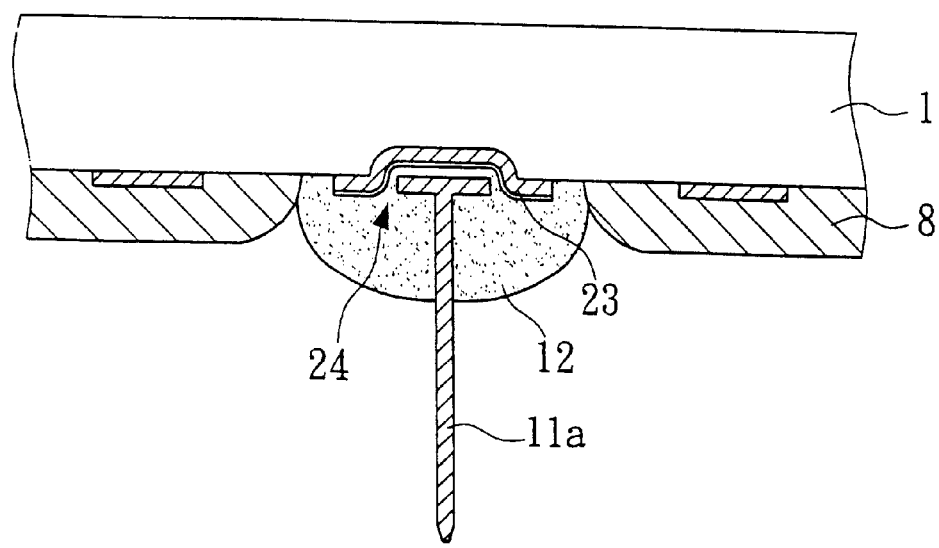
FIG. 7 illustrates, in a cross-sectional view, a pad with a recess for receiving a pin in accordance with one embodiment of the present invention

Said pad 4 may also be of any shape or configuration. For instance, as shown in FIG. 7, a pad 23 with a recess 24 for receiving the pin 11a, which can increase the contact area between said solder material 12 and pin 11a for obtaining a higher adhesion strength and enhancing the bending strength of the solder joint.

While novel features of the present invention have been described with reference to one or more particular embodiments herein, those skilled in the art will recognize that many modifications and variations of the present invention are possible. Therefore, the scope of the present invention should be limited only by the following claims.

What is claimed is:

1. A pin attachment method by surface mounting for making organic pin grid array packages, comprising:
   providing an organic wiring board having a surface that includes electrical circuitry which has at least one contact pad for receiving a pin;
   depositing a solder mask on the surface in a manner that exposes each pad and defines a well between each pad and the solder mask, with each pad separated from the solder mask by a distance; and
   soldering a pin over each pad using a solder material that is deposited in the well.

2. The method of claim 1, wherein the well is formed by the perimeter of the solder mask.

3. The method of claim 1, wherein the step of soldering a pin over each pad using a solder material is accomplished at a temperature sufficient to melt the solder material.

4. The method of claim 1, further including:
   providing at least one of the pads with an angled side wall.

5. The method of claim 4, further including:
   filling the solder material into a recess defined by the angled side wall.

6. The method of claim 1, further including:
   providing at least one of the pads with a recess for receiving a corresponding pin.

7. The method of claim 1, further including:
   providing at least one pin with dendrites.

8. The method of claim 1, further including:
   providing each pin in the form of a metal lead.

9. The method of claim 1, further including:
   providing a barrier layer over at least one of the pins, the barrier layer including an adhesive layer of nickel and a protective layer of gold.

10. A pin attachment method by surface mounting for making organic pin grid array packages, comprising:
    providing an organic wiring board having a surface that includes electrical circuitry;
    providing at least one contact pad for receiving a pin;
    providing at least one of the pads with an angled side wall;
    defining a well on the surface between the at least one pad and a solder mask, with each pad separated from the solder mask by a distance; and
    soldering a pin over each pad using a solder material that is deposited in the well.

* * * * *